(12) United States Patent
Lee (10) Patent No.: US 6,383,834 B1
(45) Date of Patent: May 7, 2002

(54) CHARGE COUPLED DEVICE

(75) Inventor: Seo Kyu Lee, Chungcheongbuk-do (KR)

(73) Assignee: LG Semicon Co., Ltd., Chungcheongbuk-do (KR)

( * ) Notice: Subject to any disclaimer, the term of this patent is extended or adjusted under 35 U.S.C. 154(b) by 0 days.

(21) Appl. No.: 09/222,679

(22) Filed: Dec. 29, 1998

(30) Foreign Application Priority Data

Dec. 30, 1997 (KR) .............................. 97-79133

(51) Int. Cl.[7] ............................................. H01L 27/148
(52) U.S. Cl. ............................. 438/60; 438/75; 438/78
(58) Field of Search ........................ 257/448; 438/60, 438/75, 78

(56) References Cited

U.S. PATENT DOCUMENTS 4,387,354 A    6/1983  Angle
5,463,232 A  * 10/1995  Yamashita et al.

OTHER PUBLICATIONS

Yamaguchi, et al, IEEE Workshop on CCD and AIS,"A 1/3–inch 330k Square–Pixel Progressive–Scan IT–CCD", (1995).

* cited by examiner

Primary Examiner—George Fourson
(74) Attorney, Agent, or Firm—Birch, Stewart, Kolasch & Birch, LLP (57) ABSTRACT

The charge coupled device (CCD) formed according the method of the present invention includes a substrate, at least two photodiodes formed in the substrate and a first insulating layer formed on the substrate. A first transfer gate is formed on a portion of the first insulating layer between the photodiodes. A second insulating layer covers the first transfer gate, and has a projecting portion projecting up from the first transfer gate. The CCD further includes second and third transfer gates disposed over respective sides of the projecting portion of the second insulating layer and the first transfer gate with the second and third transfer gates having a gap therebetween over the projecting portion. A third insulating layer covers the second and third transfer gates, and a fourth transfer gate is formed over a portion of the second and third transfer gates and over the projecting portion of the second insulating layer.

12 Claims, 11 Drawing Sheets

CHARGE COUPLED DEVICE

BACKGROUND OF THE INVENTION

1. Field of the Invention

The present invention relates to a charge coupled device (CCD) and, more particularly, to a CCD and method of fabricating the same, which reads signal charges completely and increases the fill factor of its pixel, to improve the sensitivity.

2. Discussion of Related Art

Figure 1:
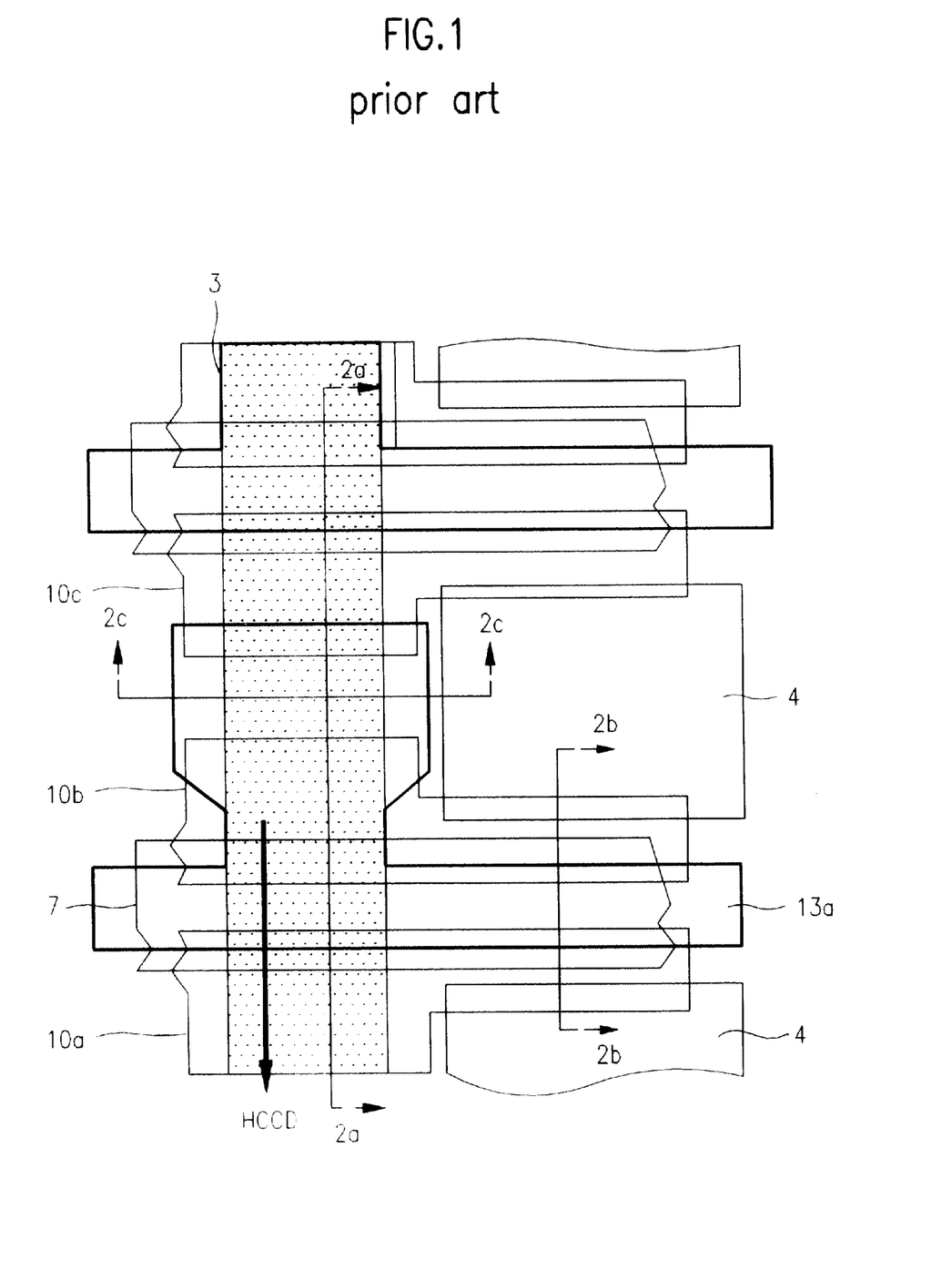
FIG. 1 is a plan view of a conventional 4-phase CCD formed using triple polysilicon layers.
Figure 2A:
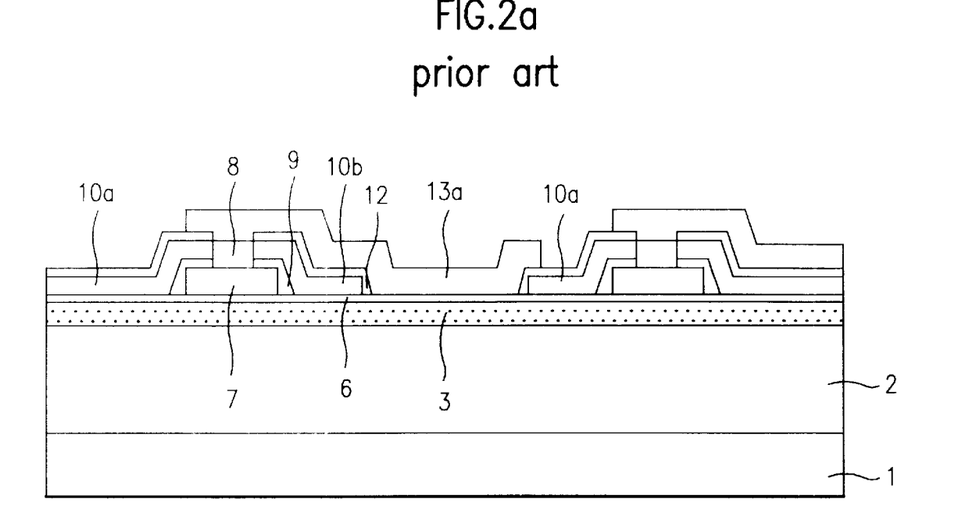
FIG. 2a is a cross-sectional view of the conventional CCD, taken along line 2a—2a of FIG. 1.
Figure 2B:
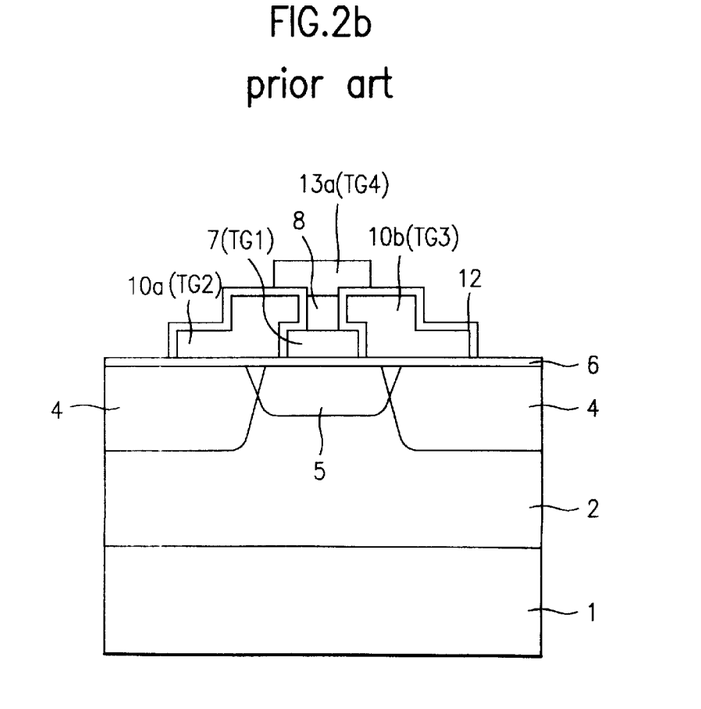
FIG. 2b is a cross-sectional view of the conventional CCD, taken along line 2b—2b of FIG. 1.
Figure 2C:
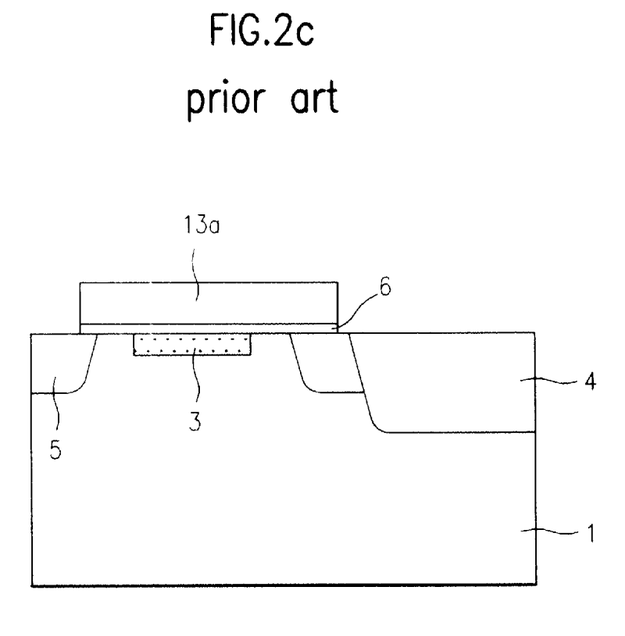
FIG. 2c is a cross-sectional view of the conventional CCD, taken along line 2c—2c of FIG. 1.
Figure 3:
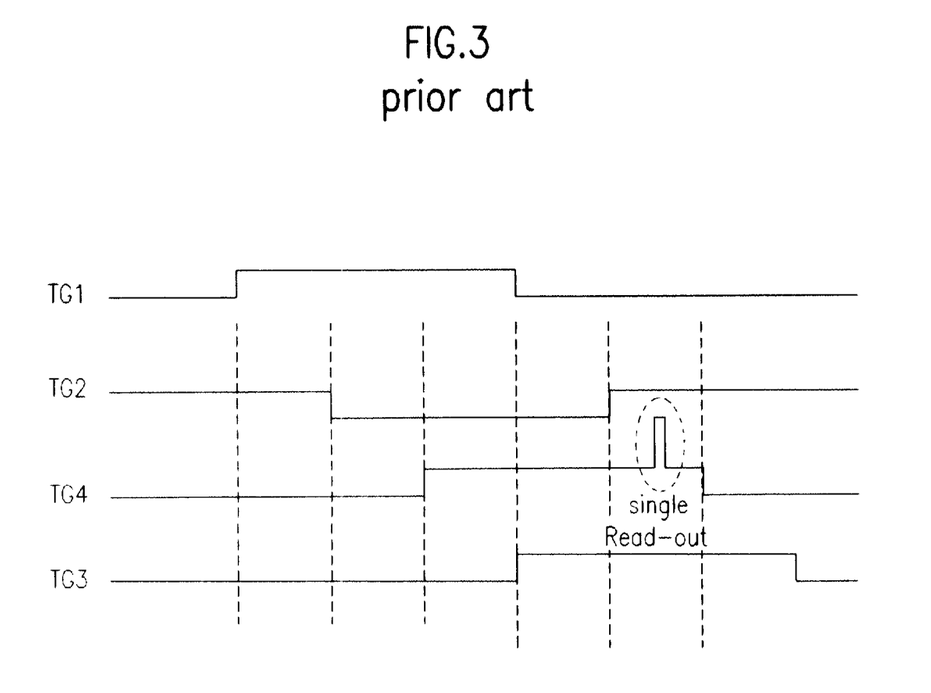
FIG. 3 show readout clocks of the conventional CCD.

A conventional CCD is constructed in such a manner that photodiodes are arranged in matrix form, and vertical charge coupled devices (VCCDs), which receive charges accumulated in the photodiodes and transmit them to horizontal charge coupled devices (HCCDs) are formed in a row between the photodiodes. At present, a 4-phase VCCD using triple polysilicon layers is employed as the vertical charge transfer region of quarter-inch three hundred thirty thousand square pixel progressive scan CCDs (PS-CCDs). A conventional CCD having the 4-phase VCCD structure using the triple polysilicon layers and method of fabricating the same are explained below with reference to the attached drawings. FIG. 1 is a plan view of the conventional CCD using the 4-phase VCCD structure of triple polysilicon layers, FIG. 2A is a cross-sectional view of the conventional VCCD, taken along line 2a—2a of FIG. 1, FIG. 2b is a cross-sectional view of the conventional CCD, taken along line 2b—2b of FIG. 1, and FIG. 2c is a cross-sectional view of the conventional CCD, taken along line 2c—2c of FIG. 1. FIG. 3 show readout clocks of the conventional CCD, and FIGS. 4a to 4d are cross-sectional views showing a method of fabricating the conventional CCD.

Referring to FIGS. 1, 2a, 2b and 2c, the conventional CCD is constructed in such a manner that a P-well 2 is formed in an N-type semiconductor substrate 1 to a predetermined depth, and a buried charge coupled device (BCCD) 3 is formed in P-well 2 in the direction of VCCD. A first interlevel oxide layer 6 is formed over the substrate 1. The first transfer gates 7, formed of a first polysilicon layer, are formed in parallel in the row direction, at a specific interval on the first interlevel oxide layer 6. The first interlevel oxide layer 6 and the first transfer gates 7 are formed between photo diodes 4, and a portion of each is formed on the BCCD 3. A block oxide layer 8 is formed on a portion of the first transfer gate 7, and a second interlevel oxide layer 9 is formed to cover the remaining portions of the first transfer gate 7. Second and third transfer gates 10a and 10b are superposed on both edges of each first transfer gate 7, the gap region between photodiodes 4 and the first transfer gate 7 in the row direction, on the edges of the photodiodes 4, and a region of the BCCD 3. The second and third transfer gates 10 and 10b are also arranged in parallel. A third interlevel oxide layer 12 is formed to cover the second and third transfer gates 10a and 10b. A fourth transfer gate 13a is formed over the first transfer gate 7 between the photodiodes 4, and is partially superposed on the second transfer gate 10a, the third transfer gate 10b, the BCCD 3 and a neighboring second transfer gate 10a' in the VCCD region (See FIG. 2a).

Figure 4A:
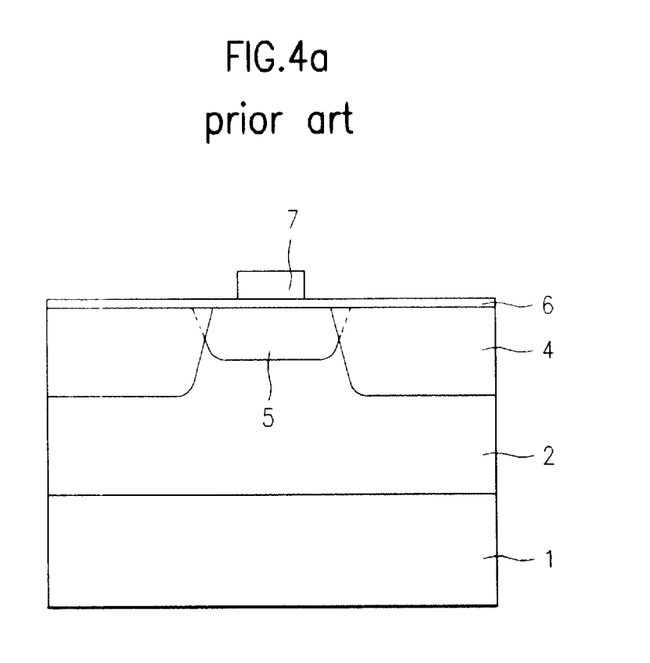
FIGS. 4a to 4d are cross-sectional views showing a method of fabricating the conventional CCD.

A method of fabricating the first, second, third and fourth transfer gates 7, 10a, 10b and 13a formed between the photodiodes 4 in the row direction is described below. Referring to FIG. 4a, P-type ions are implanted into N-type semiconductor substrate 1 and thermal diffusion is carried out to form P-well 2 to a predetermined depth. A pattern for forming photodiodes 4 is formed on P-well 2, and N-type impurity ions are implanted into P-well 2 to a predetermined depth to form a plurality of photodiodes 4 in a matrix. Then, a P-type channel stop region 5 is formed in a portion of P-well 2 between photodiodes 4 so as to come into contact with one side of each of photodiodes 4 in the row direction. A first interlevel oxide layer 6 is thinly formed on the overall surface of the substrate 1, and a first polysilicon layer is formed thereon. The first polysilicon layer is anisotropic-etched to leave polysilicon on the channel stop region 5 between photodiodes 4 and form the first transfer gate 7.

Figure 4B:
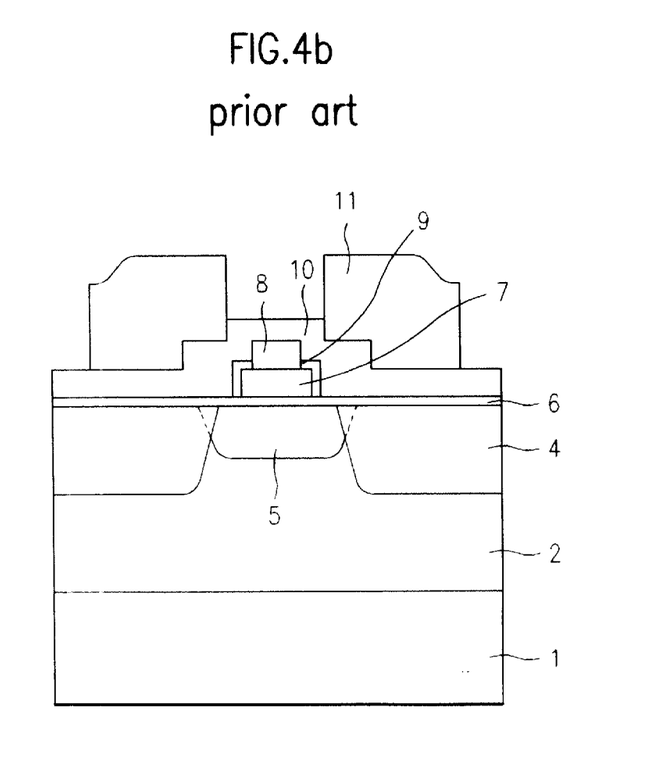
Figure 4C:
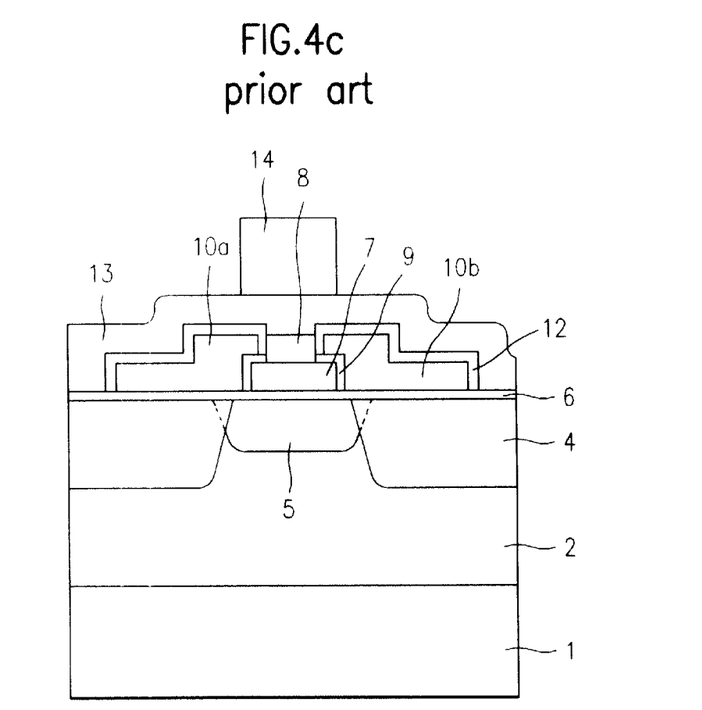

Referring to FIG. 4b, an oxide layer is deposited through chemical vapor deposition (CVD) and anisotropic-etched to form a block oxide layer 8 on a center portion of the first transfer gate 7. A second interlevel oxide layer 9 is formed to cover the exposed portions of the first transfer gate 7, and a second polysilicon layer 10 is formed over the substrate 1. A photoresist 11 is coated on second polysilicon layer 10, and then selectively exposed and developed. Referring to FIG. 4c, second polysilicon layer 10 is anisotropic-etched using the patterned photoresist 11 as a mask to form second and third transfer gates 10a and 10b which are superposed on the edges of first transfer gate 7 and are arranged on neighboring photodiodes 4 in parallel. A third interlevel oxide layer 12 is formed to cover second and third transfer gates 10a and 10b, and a third polysilicon layer 13 is formed over the substrate 1. A photoresist 14 is coated on third polysilicon layer 13, and patterned through exposure and development processes.

Figure 4D:
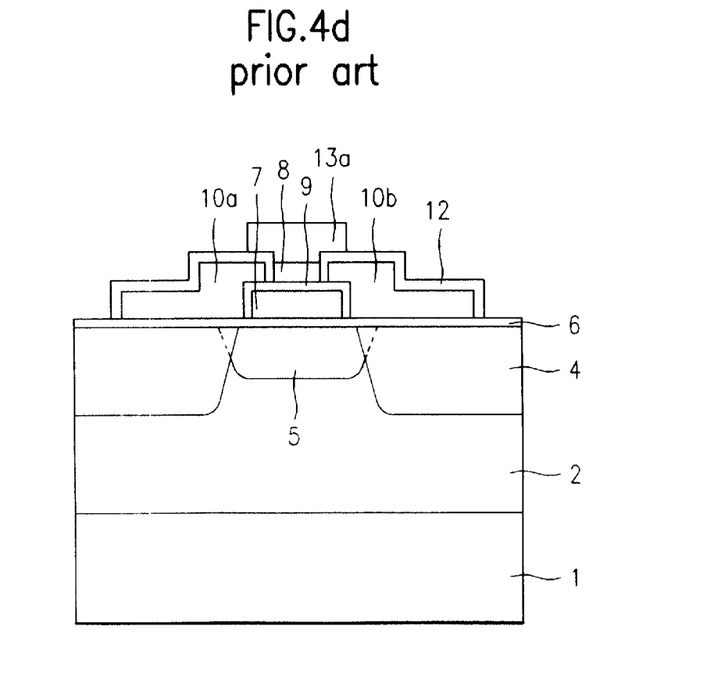

Referring to FIG. 4d, the third polysilicon layer 13 is anisotropic-etched using the patterned photoresist as a mask to form the fourth transfer gate 13a, which is placed over the first transfer gate 7 in the row direction and is superposed on the second and third transfer gates 10a and 10b and another second transfer gate 10a' of a neighboring photodiode 4.

The operation of the above conventional CCD is explained below. As shown in FIG. 3, fourth transfer gate 13a formed of third polysilicon layer 13 and formed between photodiodes 4 in the row direction, is clocked. Namely, a single readout is applied to fourth transfer gate 13a, when the charges accumulated in the photodiode 4 are transferred to the VCCD (i.e., BCCD 3), to thereby read-out the charges to the VCCD. Then, the charges, which have been moved to the VCCD, are transmitted to the HCCD according to clock timings TG1, TG2, TG3 and TG4 for the first, second, third and fourth transfer gates 7, 10a, 10b, and 13a. Here, it is difficult to transmit the charges stored in one photodiode 4 to the VCCD completely because the second and third transfer gates 10a and 10b come into contact with neighboring photodiodes 4. Thus, only fourth transfer gate 13a is clocked when the charges are transmitted from photodiode 4 to the VCCD.

The aforementioned conventional CCD has the following problems. First of all, since the second and third transfer gates, placed between the photodiodes in the row direction are superposed on one side of the first transfer gate, the capacitance between the polysilicon layers increases as their widths widen. The structure of the CCD also makes it difficult to reduce the size of the CCD. Furthermore, only the fourth transfer gate formed of the third polysilicon layer is tri-level clocked when the signal charges are read-out. Accordingly, three-dimensional effects increase as the pixel size is reduced, and this obstructs complete readout.

SUMMARY OF THE INVENTION

Accordingly, the present invention is at least directed to a CCD and method of fabricating the same that substantially obviates one or more of the problems due to limitations and disadvantages of the related art.

Another object of the present invention is to provide a CCD and method of fabricating the same, in which the fill factor of its pixel increases to improve the sensitivity, and signal charges are easily and completely read-out at a low electrode voltage.

These and other objects are achieved by a charge coupled device, comprising: a substrate; at least two photodiodes formed in the substrate; a first insulating layer formed on the substrate; a first transfer gate formed on a portion of the first insulating layer between the photodiodes; a second insulating layer covering the first transfer gate, and having a projecting portion projecting up from the first transfer gate; second and third transfer gates disposed over respective sides of the projecting portion of the second insulating layer and the first transfer gate, the second and third transfer gates having a gap therebetween over the projecting portion; a third insulating layer covering the second and third transfer gates; and a fourth transfer gate formed over a portion of the second and third transfer gates and over the projecting portion of the second insulating layers.

These and other objects are further achieved by a charge coupled device, comprising: a substrate; at least two photodiodes formed in the substrate; a first insulating layer formed on the substrate; a first transfer gate formed on a portion of the first insulating layer between the photodiodes and over adjacent sides of the photodiodes; a second insulating layer covering the first transfer gate; second and third transfer gates disposed over respective sides of the first transfer gate, the second and third transfer gates having a gap there etween over the first transfer gate; a third insulating layer covering the second and third transfer gates; and a fourth transfer gate formed over a portion of the second and third transfer gates.

These and other objects are still further achieved by a charge coupled device, comprising: a substrate; at least two photodiodes formed in the substrate; a first insulating layer formed on the substrate; a first transfer gate formed on a portion of the first insulating layer between the photodiodes; a second insulating layer covering the first transfer gate; second and third transfer gates disposed over respective sides of the first transfer gate, the second and third transfer gates having a gap therebetween over the first transfer gate and the second and third transfer gates not extending past sides of the first transfer gate adjacent to the photodiodes; a third transfer gate covering the second and third transfer gates; and a fourth transfer gate formed over a portion of the second and third transfer gates.

These and other objects are additionally achieved by a method of forming a charge coupled device, comprising: a) providing a substrate having at least two photodiodes formed therein; b) forming a first insulating layer on the substrate; c) forming a first transfer gate on a portion of the first insulating layer between the photodiodes; d) covering the first transfer gate with a second insulating layer having a projecting portion projecting up from the first transfer gate; e) forming second and third transfer gates over respective sides of the projecting portion of the second insulating layer and the first transfer gate, the second and third transfer gates having a gap therebetween over the projecting portion; f) covering each of the second and third transfer gates with a third insulating layer; and g) forming a fourth transfer gate over a portion of the second and third transfer gates and over the projecting portion of the second insulating layer.

These and other objects are also achieved by a method of forming a charge coupled device, comprising: a) providing a forming a first insulating layer on the substrate; c) forming a first transfer gate on a portion of the first insulating layer between the photodiodes and over adjacent sides of the photodiodes; d) covering the first transfer gate with a second insulating layer; e) forming second and third transfer gates over respective sides of the first transfer gate, the second and third transfer gates having a gap therebetween over the first transfer gate; f) covering each of the second and third transfer gates with a third insulating layer; and g) forming a fourth transfer gate over a portion of the second and third transfer gates.

These and other objects are further achieved by a method of forming a charge coupled device, comprising: a) providing a substrate having at least two photodiodes formed therein; b) forming a first insulating layer on the substrate; c) forming a first transfer gate on a portion of the first insulating layer between the photodiodes; d) covering the first transfer gate with a second insulating layer; e) forming second and third transfer gates over respective sides of the first transfer gate such that the second and third transfer gates do not extend past the sides of the first transfer gate adjacent to the photodiodes, the second and third transfer gates having a gap therebetween over the first transfer gate; f) covering each of the second and third transfer gates with a third insulating layer; and g) forming a fourth transfer gate over a portion of the second and third transfer gates.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENT

Reference will now be made in detail to the preferred embodiments of the present invention, examples of which are illustrated in the accompanying drawings.

Figure 5:
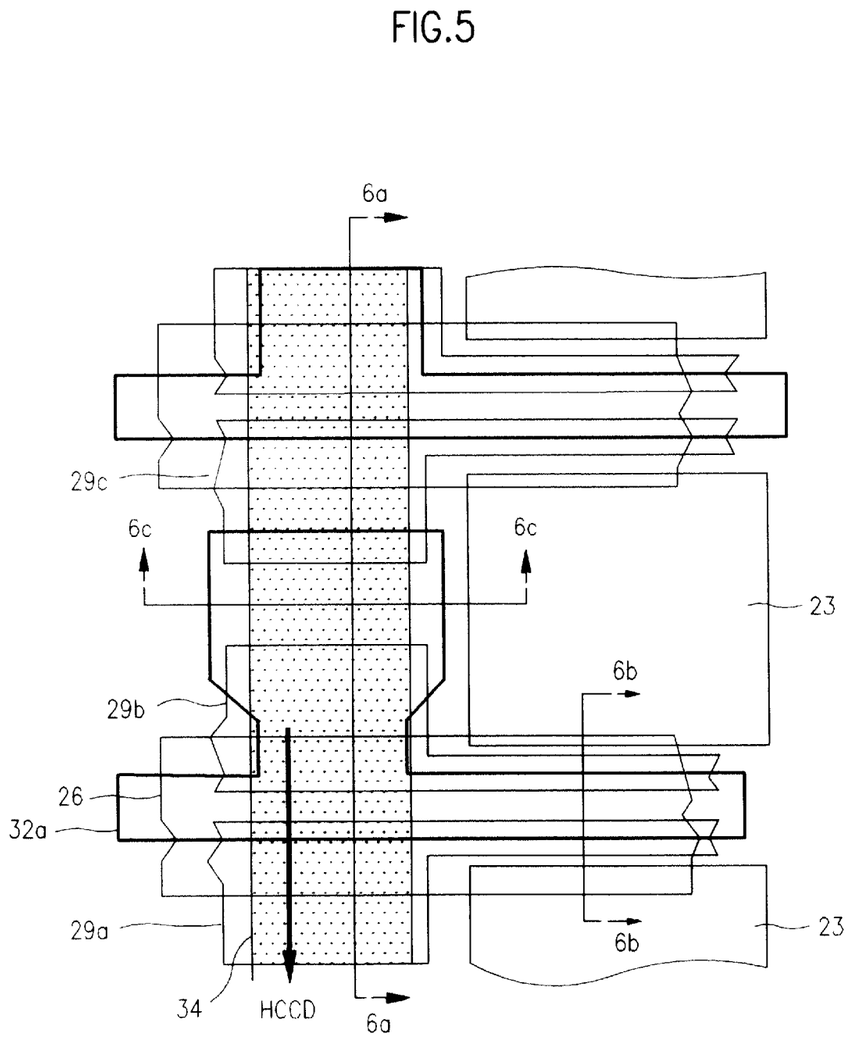
FIG. 5 is a plan view of a 4-phase CCD formed using triple polysilicon layers according to the present invention.
Figure 6A:
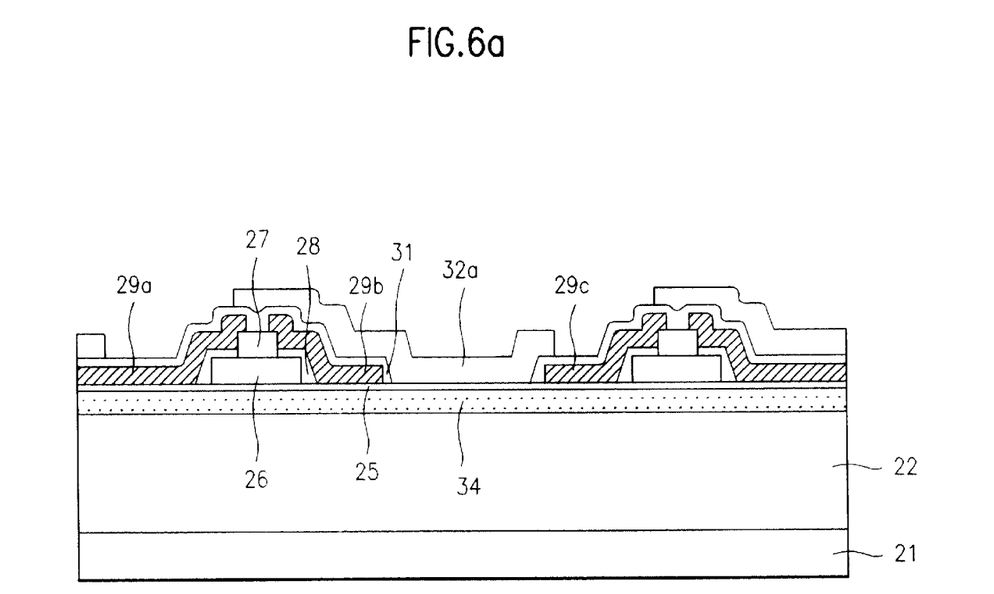
FIG. 6a is a cross-sectional view of the CCD according to the present invention, taken along line 6a—6a of FIG. 5.
Figure 6B:
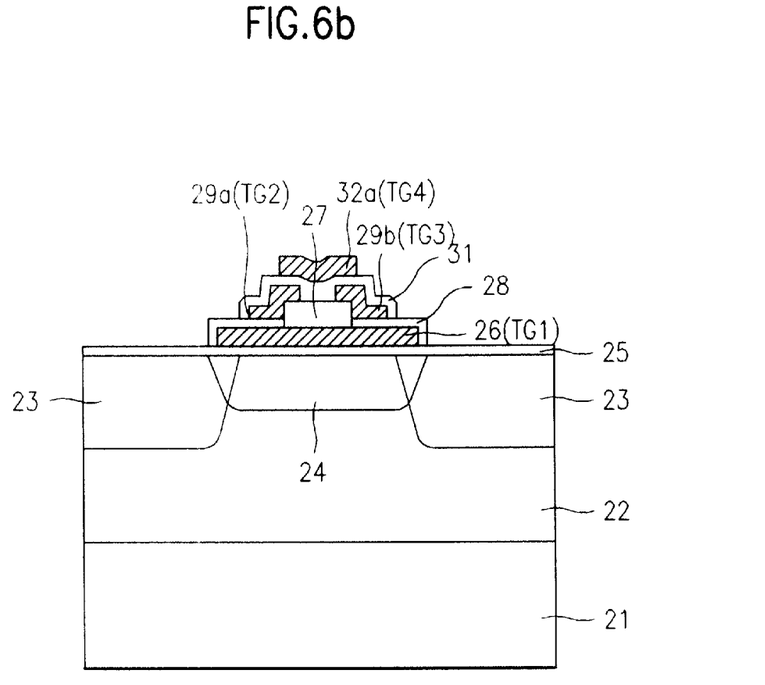
FIG. 6b is a cross-sectional view of the CCD according to the present invention, taken along line 6b—6b of FIG. 5.
Figure 6C:
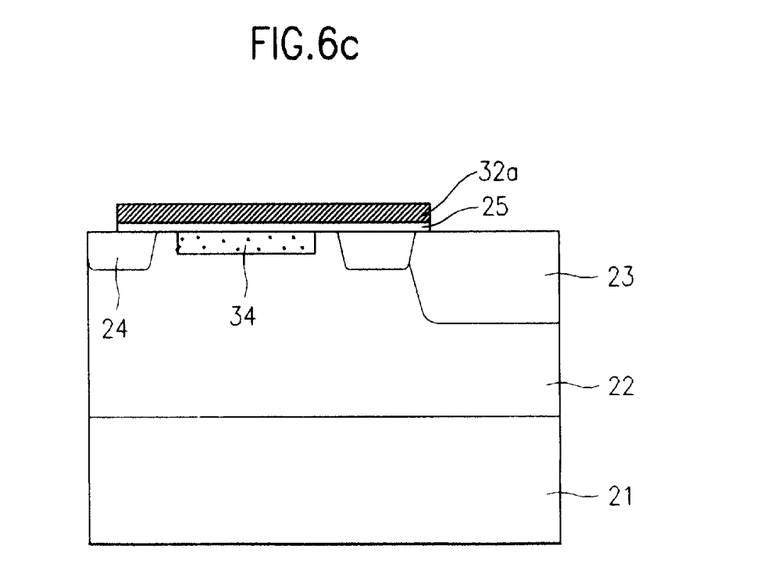
FIG. 6c is a cross-sectional view of the CCD according to the present invention, taken along line 6c—6c of FIG. 5.
Figure 7:
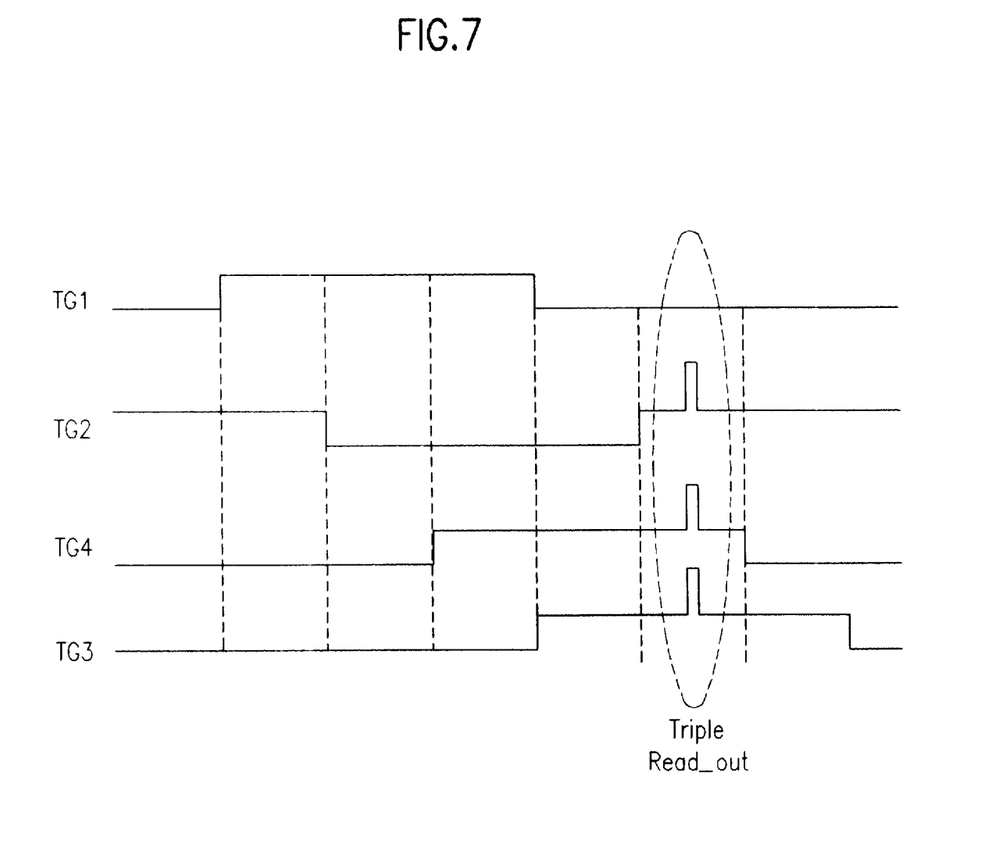
FIG. 7 show readout clocks of the CCD according to the present invention.

The present invention improves the structure of the 4-phase VCCD using triple polysilicon layers, which is being applied to quarter-inch three hundred thirty thousand square pixel CCDs to thereby increase their sensitivity. FIG. 5 is a plan view of a 4-phase CCD formed using triple polysilicon layers according to the present invention, FIG. 6a is a cross-sectional view of the CCD according to the present invention taken along line 6a—6a of FIG. 5, FIG. 6b is a cross-sectional view of the CCD according to the present invention taken along line 6b—6b of FIG. 5, and FIG. 6c is a cross-sectional view of the CCD according to the present invention taken along line 6c—6c of FIG. 5. FIG. 7 shows readout clocks of the CCD according to the present invention, and FIGS. 8a to 8d are cross-sectional views showing a method of fabricating the CCD according to the present invention.

Referring to FIGS. 5, 6a, 6b and 6c, the CCD of the present invention is constructed in such a manner that a P-well 22 is formed in an N-type semiconductor substrate 21 to a predetermined depth, and a BCCD 34 is formed in P-well 22 along the VCCD. A first interlevel oxide layer 25 is formed over the substrate 21, and a first transfer gate 26, formed of a first polysilicon layer is formed in one direction between photodiodes 23 and over a P-channel stop region 5 in the row direction in the VCCD. As shown in FIGS. 5 and 6b, the first transfer gate 26 extends over the edges of neighboring photodiodes 23. A block oxide layer 27 having a predetermined height, which is less than its width, is formed on a center portion of the first transfer gate 26 in the direction or first transfer gate 26, and a second interlevel oxide layer 28 covers the remaining portions of the first interlevel oxide layer 26. Second and third transfer gates 29a and 29b, formed of a second polysilicon layer 29, are respectively superposed on either side of the block oxide layer 27 with a gap of a predetermined distance therebetween.

The second and third transfer gates 29a and 29b are formed on first transfer gate 26 in the region between photodiodes 23 in the row direction, and are opposite to each other in the VCCD region with a gap of a predetermined distance therebetween centered at the center of first transfer gate 26. As shown in FIGS. 5 and 6b, in the region between the photodiodes 23, the second and third transfer gates 29a and 29b do not extend beyond the edges of the first transfer gate 26. The widths of the second and third transfer gates 29a and 29b can be reduced by controlling the height of the block oxide layer 27. This technique allows the size of pixel to be decreased. A third interlevel oxide layer 31 is formed on second and third transfer gates 29a and 29b and the block oxide layer 27, and a fourth transfer gate 34 is formed over the second and third transfer gate 29a and 29b formed between photodiodes 23 in the row direction. Here, the fourth transfer gate 34 extends in the VCCD region to be superposed on the second transfer gate 29a, the third transfer gate 29b and a neighboring second transfer gate 29a'.

Figure 8A:
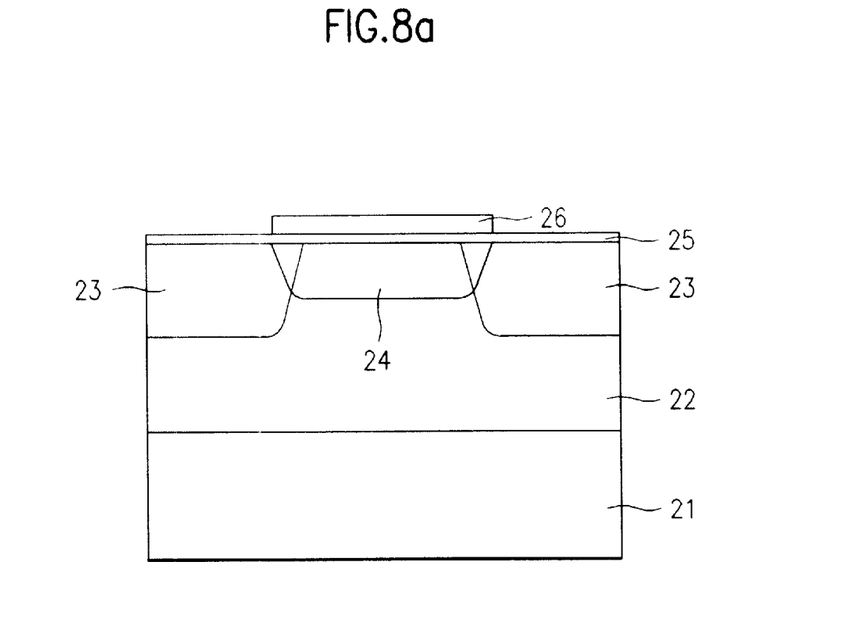
FIGS. 8a to 8d are cross-sectional views showing a method of fabricating the CCD according to the present invention.

A method of fabricating the above CCD of the present invention is explained below. Referring to FIG. 8a, P-type ions are implanted into N-type semiconductor substrate 21, and thermal diffusion is carried out to form P-well 22 in the semiconductor substrate 21 to a predetermined depth. A pattern for forming photodiodes 23 is formed on P-well 22, and N-type impurity ions are implanted into P-well 22 to a predetermined depth to form a plurality of photodiodes 23 in a matrix. Then, a P-type channel stop region 24 is formed in a portion of P-well 22 between photodiodes 23 so as to come into contact with one side of each adjacent photodiode 23. A first interlevel oxide layer 25 is thinly formed over a surface of the substrate 21, and a first polysilicon layer is formed thereon. The first polysilicon layer is anisotropic-etched to form first transfer gates 26 on the channel stop regions 24 placed between photodiodes 23 and arranged in the row direction of the VCCD region.

Figure 8B:
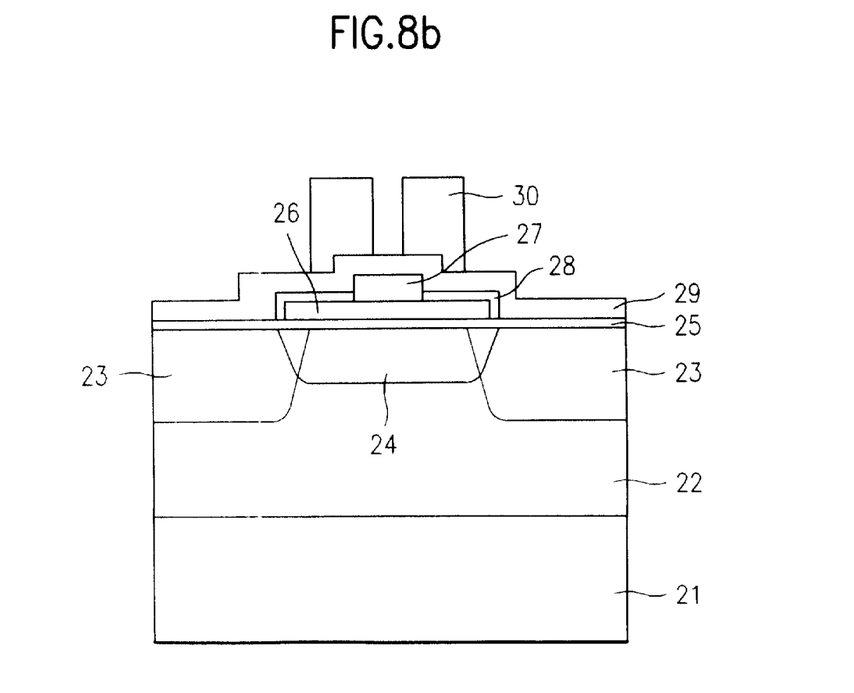
Figure 8C:
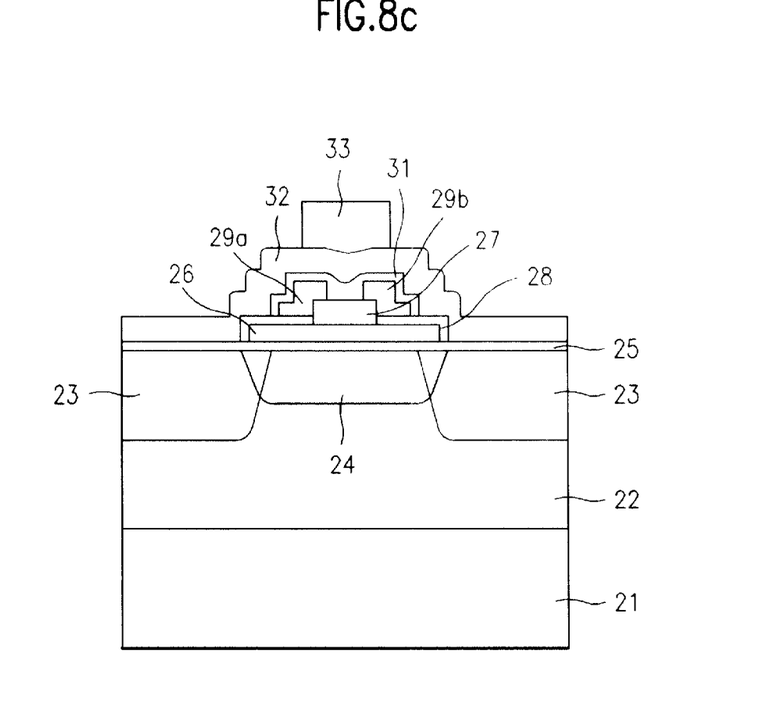

Referring to FIG. 8b, an oxide layer is deposited through CVD and anisotropic-etched to form a block oxide layer 27 on the center of first transfer gate 26. A second interlevel oxide layer 28 is formed to cover the remaining portions of the first transfer gate 26. A second polysilicon layer 29 is then formed over the first transfer gate 26. A photoresist 30 is coated on second polysilicon layer 29 and then selectively exposed and developed to form a pattern exposing portions of the second polysilicon layer 29 on the center of block oxide layer 27 and on both sides of first transfer gate 26. Referring to FIG. 8c. The second polysilicon layer 29 is anisotropic-etched using the patterned photoresist 30 as a mask to form the second and third transfer gates 29a and 29b having a gap of a predetermined distance therebetween. As shown, the second and third transfer gates 29a and 29b are superposed on either edge of the first transfer gate 26, respectively, but do not extend beyond those edges in the region between the photodiodes 23 (see FIG. 5 as well). The areas of second and third transfer gates 29a and 29b can be varied by controlling the height of block oxide layer 27.

Figure 8D:
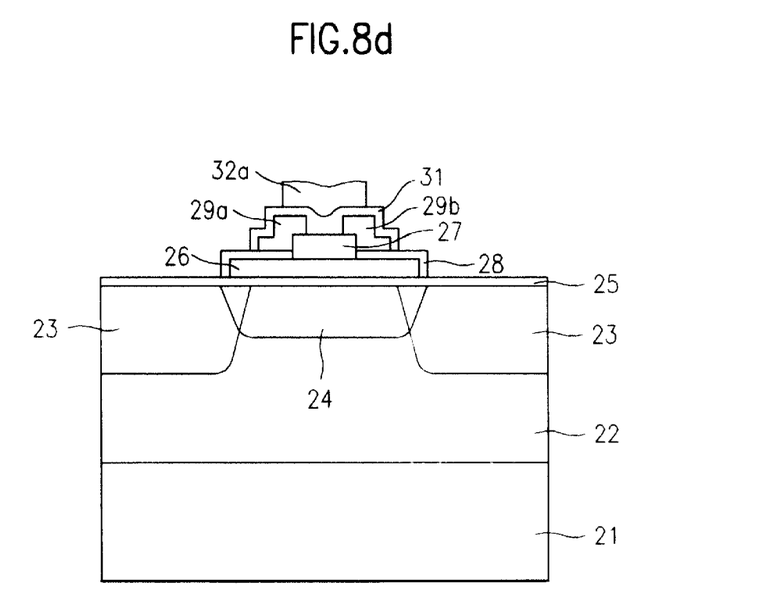

Thereafter, a third interlevel oxide layer 31 is formed on the second transfer gate 29a, and the third transfer gate 29b, and extends over the block oxide layer 27. A third polysilicon layer 32 is formed over the resulting structure. Photoresist is coated on the third polysilicon layer 32, and patterned through exposure and development to leave patterned photoresist 33 over portions of the second and third transfer gates 29a and 29b and the block oxide layer 27. Referring to FIG. 8d, the third polysilicon layer 32 is anisotropic-etched using the patterned photoresist 33 as a mask to form the fourth transfer gate 32a. The fourth transfer gate 32a is formed over portions of the second and third transfer gates 29a and 29b and the block oxide layer 27 in the region between the photodiodes 23 in the row direction, and is partially superposed on a neighboring second transfer gate 29a' in the VCCD region as shown in FIG. 6a. A fourth interlevel oxide layer can be formed on the fourth transfer gate 32a through thermal oxidation.

The operation of the CCD of the present invention is described below. The second and third transfer gates 29a and 29b formed of the second polysilicon layer 29 are placed on first transfer gate 26, and the fourth transfer gate 32a is placed on the second and third transfer gates 29a and 29b. Accordingly, as shown in FIG. 7, second, third and fourth transfer gate signals TG2, TG3 and TG4 applied to the second, third and fourth transfer gates 29a, 29b, and 32a are simultaneously clocked. That is, a triple readout is performed for the three transfer gates, when charges received by the photodiodes 23 are read to the VCCD. This triple read-out more easily and completely reads-out the charges accumulated in the photodiodes 23 to the VCCD. These charges, which have been moved to the VCCD, are then transmitted to the HCCD according to the clock timings TG1, TG2, TG3 and T64 of the first, second, fourth and third transfer gates 26, 29a, 29b, and 32.

The above-described CCD and method of fabricating the same according to the present invention have the following advantages. Firstly, the width of the second polysilicon layer can be reduced by increasing its vertical length using the block oxide layer, and thus it Is possible to decrease the widths of the second, third and fourth transfer gates for triple readout and reduce the overlap capacitance between the first, second and third polysilicon layers. Secondly, when the signal charges accumulated in the photodiodes are read-out, the second, third and fourth transfer gates are turned on, to easily and completely transmit the charges to the VCCD. Thirdly, the widths of the second and third transfer gates are reduced by controlling the height of the block oxide layer to decrease the width of the transfer gate placed between the photodiodes and obtain a small-size pixel. Fourthly, the fill factor of the pixel is increased to improve the sensitivity thereof. Fifth, the driving voltage for readout can be lower than that in the conventional case because the three transfer gates can be simultaneously read-out in order to transmit the charges stored in the photodiodes to the VCCD.

It will be apparent to those skilled in the art that various modifications and variations can be made in the CCD and method of fabricating the same of the present invention without departing from the spirit or scope of the invention. Thus, it is intended that the present invention cover the modifications and variations of this invention provided they come within the scope of the appended claims and their equivalents.

What is claimed is:

1. A charge coupled device comprising:

a substrate;

at least two photodiodes formed in the substrate;

a first insulating layer formed on the substrate;

a first transfer gate formed on a portion of the first insulating layer between the photodiodes;

a second insulating layer covering the first transfer gate, and having a projecting portion projecting vertically from the first transfer gate with respect to a horizontal alignment of the first transfer gate;

second and third transfer gates disposed horizontally over respective sides of the vertically projecting portion of the second insulating layer and the first transfer gate, the second and third transfer gates having a gap therebetween over the vertically projecting portion;

a third insulating layer covering the second and third transfer gates; and a fourth transfer gate formed over a portion of the second and third transfer gates and over the projecting portion of the second insulating layer.

2. The charge coupled device of claim 1, wherein the first transfer gate is formed on the portion of the first insulating layer between the photodiodes and over adjacent sides of the photodiodes.

3. The charge coupled device of claim 2, wherein the second and third transfer gates do not extend past sides of the first transfer gate adjacent to the photodiodes.

4. The charge coupled device of claim 1, wherein the second and third transfer gates do not extend past sides of the first transfer gate adjacent to the photodiodes.

5. The charge coupled device of claim 1, wherein the projecting portion has a block shape.

6. The charge coupled device of claim 1, wherein the projecting portion is disposed over a center portion of the first transfer gate.

7. The charge coupled device of claim 1, wherein the projecting portion has a width less than a width of the first transfer gate.

8. The charge coupled device of claim 1, wherein the projecting portion has a height and a width, and the height is less than the width.

9. The charge coupled device of claim 1, further comprising:

a plurality of photodiodes arranged in a matrix and formed in the substrate: and wherein the first, second, third and fourth transfer gates and the second and third insulating layers are formed between each pair of vertically adjacent photodiodes.

10. The charge coupled device as claimed in claim 1, wherein said third insulating layer is separate from the second insulating layer, and covers the second and third transfer gates without covering a portion of the first transfer gate.

11. A charge coupled device comprising:

a substrate;

at least two photodiodes formed in the substrate;

a first insulating layer formed on the substrate;

a first transfer gate formed on a portion of the first insulating layer and horizontally overlapping a one side of each of the photodiodes;

a second insulating layer covering the first transfer gate;

second and third transfer gates disposed over respective sides of the first transfer gate, the second and third transfer gates having a gap therebetween over the first transfer gate;

a third insulating layer covering the second and third transfer gates; and fourth transfer gate formed over a portion of the second and third transfer gates.

12. A charge coupled device, comprising:

a substrate:

at least two photodiodes formed in the substrate;

a first insulating layer formed on the substrate;

a first transfer gate formed on a portion of the first insulating layer between the photodiodes;

a second insulating layer covering the first transfer gate;

second and third transfer gates disposed over respective sides of the first transfer gate, the second and third transfer gates having a gap therebetween over the first transfer gate and the second and third transfer gates not extending past sides of the first transfer gate adjacent to the photodiodes;

a third transfer gate covering the second and third transfer gates; and a fourth transfer gate formed over a portion of the second and third transfer gates.

* * * * *